United States Patent [19]

Nakajima et al.

[11] Patent Number: 4,702,796
[45] Date of Patent: Oct. 27, 1987

[54] METHOD FOR FABRICTING A SEMICONDUCTOR DEVICE

[75] Inventors: Masayuki Nakajima; Shinichi Sato; Akira Tokui; Akira Kawai; Masao Nagatomo; Hiroji Ozaki, all of Hyogo, Japan

[73] Assignee: Mitsubishi Denki Kabushiki Kaisha, Tokyo, Japan

[21] Appl. No.: 931,583

[22] Filed: Nov. 14, 1986

[30] Foreign Application Priority Data

Dec. 16, 1985 [JP] Japan ................................ 60-284630
Dec. 18, 1985 [JP] Japan ................................ 60-285162

[51] Int. Cl.⁴ .................... H01L 21/04; H01L 21/22; H01L 21/306; B44C 1/22
[52] U.S. Cl. .................................. 156/653; 156/648; 156/657; 357/23.6; 357/72; 357/80; 437/43; 437/52
[58] Field of Search ............... 156/643, 648, 653, 657, 156/659.1, 661.1, 662; 29/571, 576 B, 576 W, 577 C, 580, 588; 148/1.5, 187, 190; 427/93; 357/23.1, 23.6, 41, 47, 49, 72, 80, 91

[56] References Cited

U.S. PATENT DOCUMENTS 4,335,502 6/1982 Richman ...................... 156/653 X
4,536,947 8/1985 Bohr et al. ........................ 29/576 C

OTHER PUBLICATIONS

"Double Polysilicon Dynamic Random-Access Memory Cell with Increased Charge Storage Capacitance", V. L. Rideout, IBM Technical Disclosure Bulletin, vol. 21, No. 9, Feb. 1979, pp. 3823-3825.

Primary Examiner—William A. Powell
Attorney, Agent, or Firm—Lowe Price LeBlanc Becker & Shur

[57] ABSTRACT

The present invention is a method for fabricating a semiconductor device, wherein impurity is selectively diffused to surround a region (7) of a second conductivity type as a bit line formed on a semiconductor substrate (1), thereby forming an impurity diffused region (9) of a first conductivity type having high density and, by extending the impurity diffused region (9) in the element separating step to form a high density region of the first conductivity type having high density.

10 Claims, 13 Drawing Figures

METHOD FOR FABRICTING A SEMICONDUCTOR DEVICE

Prior Art

1. Field of the Invention

The present invention relates to a method for fabricating a semiconductor device. More specifically, it relates to a method for fabricating a memory cell in a semiconductor memory device in which presence or absence of electric charge is stored as memory information.

2. Description of the Prior Art

In a dynamic RAM, which is an example of a semiconductor memory device, the memory cell capacitance is increased by forming $N^+/P^+$ region by ion implantation into a memory capacitor region. Such technology is disclosed in "Double Polysilicon Dynamic Random Access Memory Cell with Increased Charge Storage Capacitance" in IBM Technical Disclosure Bulletin Vol. 21 No. 9 February 1979.

FIG. 1 shows the structure of the afore mentioned memory cell of the dynamic RAM. In FIG. 1, the memory cell of the dynamic RAM is composed of a semiconductor substrate 1 having a P− type conductivity, a gate electrode 2 connected to a supply terminal T1, a gate electrode 3 connected to a connection terminal T2 for word line connection, a gate insulating film 4, an interlayer insulating film 5, a $N^+$ region 6 as a charge storage region, a $N^+$ region 7 as a bit line, an element separating insulating film 8 for separating elements and a $P^+$ region 9 for separating elements. Depletion layers 10 and 11 are formed between the $N^+$ region 6 and the semiconductor substrate 1, and $N^+$ region 7 and the substrate 1, respectively.

In FIG. 1, wirings and protection films are omitted and the region 6 is denoted as a $N^+$ diffused region in order to simplify the description. In a common structure, a positive potential is applied to the gate electrode 2 to induce an $N^+$ inversion layer on a portion corresponding to the region 6 on the substrate surface through the gate insulating film 4 for storing charges.

In the dynamic RAM structured as described above, the $N^+$ region 6 constitutes a charge storage region in the memory cell and, when electrons are stored in the $N^+$ region 6, the condition is "0" and, when no electron is stored in the region, then the condition is "1". The potential of the $N^+$ region 7 as a bit line is held at a predetermined intermediate potential by means of a sense amplifier (not shown).

When the potential of the word line rises and the potential of the gate electrode 3, which is connected to the word line as a transfer gate, becomes higher than the threshold voltage, a channel of $N^+$ inversion layer is formed directly below the gate electrode 3 to render the $N^+$ regions 6 and 7 conductive.

In case where the memory information of the memory cell is "0", namely, electrons are charged in the $N^+$ region 6, the potential of the $N^+$ region 7, which is held at an intermediate potential, lowers due to the conduction of the $N^+$ region 6 and the $N^+$ region 7 as a bit line. On the other hand, in case where the memory information of the memory cell is "1", namely, no electron is stored in the $N^+$ region 6, the potential of the $N^+$ region 7 which is held at the intermediate potential rises due to the conduction. The change of the potential on the bit line is sensed and amplified by the sense amplifier to be outputted, while the same memory information is refreshed to be written in the memory cell again within the same cycle.

However, in a conventional memory cell, since the charge storage region 6 and the bit line 7 are formed of $N^+$ regions or $N^+$ inversion layers, electrons of the electron hole pairs generated by radiation such as α ray which irradiates in the memory chip are coupled to the holes of these charge storage region 6 and the bit line 7. Consequently, original memory information is inverted, resulting in a malfunction causing possible generation of soft errors.

SUMMARY OF THE INVENTION

An object of the present invention is to provide a method for fabricating a semiconductor memory device in which the characteristics of a transistor is not degraded even if in a minute structure and which is capable of removing soft errors derived from radiation such as α ray with a simple structure.

The present invention is a method for fabricating a semiconductor memory device, in which a high density region of a first conductivity type having higher density than that of the semiconductor substrate is formed surrounding the region of a second conductivity type formed on the semiconductor substrate of the first conductivity type. A first insulating film is formed on the semiconductor substrate of the first conductivity type. Impurities of the first conductivity type is selectively implanted and diffused by using a mask pattern for thermal oxidation to form an impurity diffused region. A second insulating film is deposited on the first insulating film and the mask pattern, and then the second insulating film is left at a step portion of the first insulating film by anisotropic etching. Thermal oxidation is carried out by using the deposited second insulating film as a mask and the first insulating film as a nuclei to form an insulating film for element separation and the impurity diffused region is extended to form a high density region.

Therefore, according to the present invention, the number of electrons is larger than that of the electrons generated by the radiation of α ray and coupled to the holes, since a high density region of the first conductivity type having higher density than the semiconductor substrate is formed surrounding the region of the second conductivity type without increasing the number of steps. Accordingly, electrons are prevented from diffusing into the region of the second conductivity type so that a malfunction caused by the incident radiation such as α ray can be eliminated.

In a preferred embodiment of the present invention, the region of the second conductivity type is formed as a region for a bit line and as an electric charge storage region.

In a more preferred embodiment of the present invention, the density of the high density region is more than ten times higher than the density of the semiconductor substrate, that is, within the range of $10^{14}$ to $10^{18}/cm^3$.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
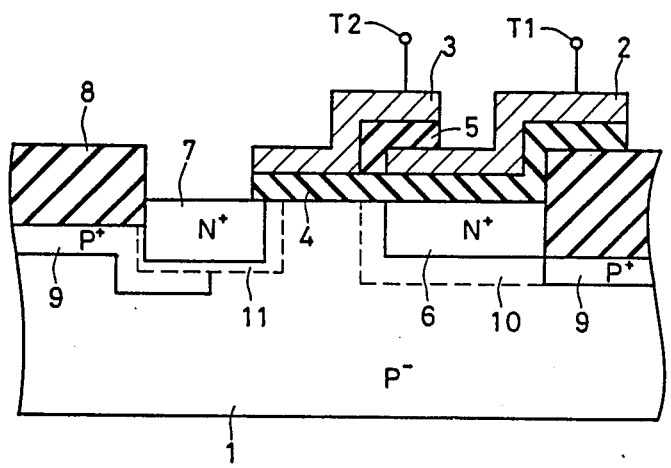
FIG. 2 is a cross sectional view of a semiconductor memory device fabricated according to the present invention.

FIG. 2 is a cross sectional view of a semiconductor memory device fabricated according to the present invention and FIGS. 3A to 3G are cross sectional views illustrating the steps of element separation according to the present invention.

Figure 3A:
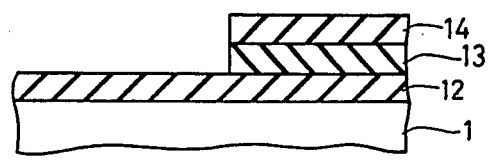
FIGS. 3A to 3G are cross sectional views showing each of the fabricating steps of the present invention.
Figure 3B:
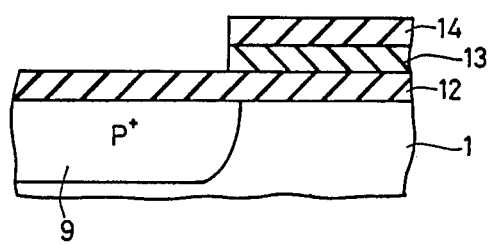

The method for fabricating the semiconductor device according to the present invention will be hereinafter described with reference to FIGS. 3A to 3G. An oxide film 12 is formed on the P type semiconductor substrate 1 as shown in FIG. 3A, and further an oxide film 14 and an nitride film 13 are formed thereon as a mask pattern on the wafer against the thermal oxidation for element separation. Then, as shown in FIG. 3B, a P+ impurity is selectively implanted and diffused using the mask pattern of the oxide film 1 and the nitride film 14 against the thermal oxidation to form a P+ region 9 as an impurity diffused region for preventing inversion.

Figure 3C:
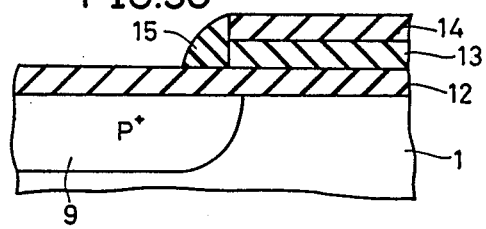
Figure 3D:
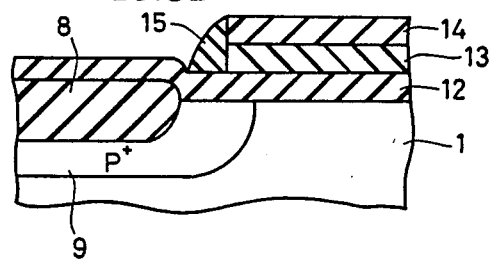

Then, a nitride ($Si_3N_4$) film 15 is deposited over the entire surface and subjected to anisotropic etching. Consequently, as shown in FIG. 3C, the nitride ($Si_3N_4$) film 15 is left only at a step portion of the nitride film 13 and the oxide film 14. Then, thermal oxidation is carried out using the nitride ($Si_3N_4$) film 15 with the oxide ($SiO_2$) film 12 serving as a nuclei to form an insulating film 8 for element separation as shown in FIG. 3D, and, at the same time, the P+ region 9 as an impurity diffused region is extended to form a P+ region 9 as a high density region.

Figure 1:
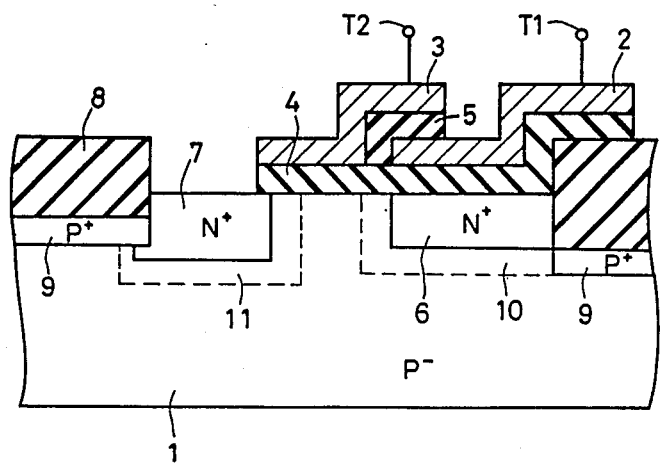
FIG. 1 is a cross sectional view showing a conventional semiconductor memory device.
Figure 3E:
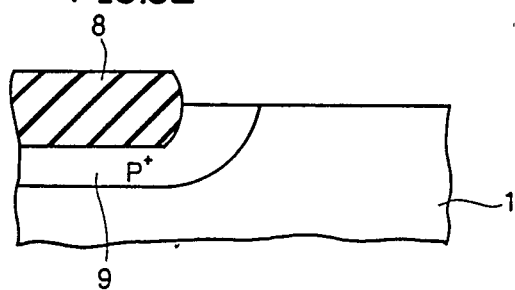
Figure 3F:
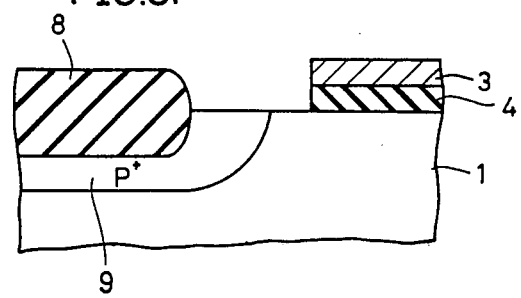
Figure 3G:
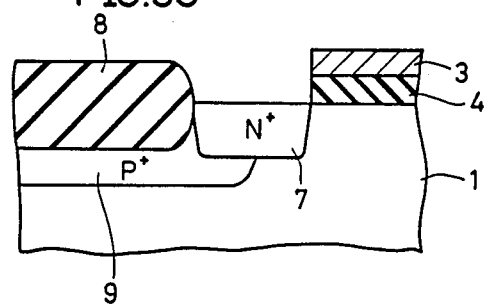

Then, as shown in FIG. 3E, the nitride ($Si_3N_4$) films 13 and 15 and oxide ($SiO_2$) films 12 and 14 are removed. Then, as shown in FIG. 3F, a gate electrode 3 and a gate insulating film 4 are formed on the semiconductor substrate 1. Then, an N+ impurity is selectively implanted and diffused using the gate electrode 3, the gate insulating film 4 and the element separating insulating film 8 formed as described above as masks, thereby an N+ region 7 is formed with a portion thereof surrounded by the P+ region 9 as shown in FIG. 3G. This FIG. 3G clearly shows the difference between FIGS. 1 and 2.

The density of the P+ layer 9 as a high density region formed as described above is preferably selected in the range of $10^{14}$ to $10^{18}/cm^3$, namely, ten times higher than that of the semiconductor substrate, $10^{13}$ to $10^{16}/cm^3$. As a passivation film which will be later formed on the semiconductor memory device shown in FIG. 2, a material having low dielectric constant, such as PSG, may be used.

Now, the above described soft errors are induced because electrons of the electron hole pairs generated when the radiation such as α ray enters into the chip are collected in the N+ region serving as a charge storage region and in the N+ region 7 serving as a bit line. Namely, the α ray entered into the chip generates a number of electron hole pairs along the locus thereof until it loses energy and comes to a stop; the electron hole pairs generated in the depletion layers 10 and 11 are immediately separated due to the electric field in the depletion layer; the electrons are collected in the N+ regions 6 and 7 while holes flow down through the semiconductor substrate 1. The electron hole pairs generated in the N+ regions 6 and 7 are recombined so that they do not contribute to the increase or decrease of electrons; among the electron hole pairs generated in the semiconductor substrate 1, only the electrons having reached the depletion layers 10 and 11 by diffusion are collected in the N+ regions 6 and 7 to cause soft errors, and other electrons are recombined in the semiconductor substrate 1.

Therefore, the present embodiment presents the following advantages by surrounding the N+ region 7 with a P+ region 9 having higher density than the semiconductor substrate 1.

(1) The width of the depletion layer 11 formed in the interface of the N+ region 7 and the P+ region 9 is decreased, thereby increasing the capacitance of the N+ region 7.

(2) Since a part of the N+ region 7 is formed within the P+ region 9, the diffused electrons from the semiconductor substrate 1 are recombined in the P+ region 9 and do not reach the N+ region 7.

(3) Since a potential barrier against electrons is formed in the interface of the semiconductor substrate 1 and the P+ region 9, those electrons having small energy which diffused from the semiconductor substrate 1 are not allowed to pass.

Due to the advantages described in (1), the difference of the numbers of electrons corresponding to the "0" and "1" stored in the N+ region 7 increases and the number of electrons is larger than those which generated by the irradiation of α ray and the like and combined with holes. In addition, due to the advantages described in (2) and (3), the electrons can be prevented from being diffused into the N+ region 7, thereby eliminating the generation of soft errors.

Although in the above embodiment, an example is shown in which the P+ region 9 is formed to surround the N+ region 7 as a bit line, the present invention can be similarly applied to the N+ region of the sense amplifier and to the N+ region of the peripheral circuits. Although in the above description, the present invention is applied to a dynamic type RAM, it can be similarly applied to a static type RAM. In addition, the present invention can be applied not only to the N channel but also to the P channel and it can be applied to a MOS device, bipolar device and the like.

Figure 4:
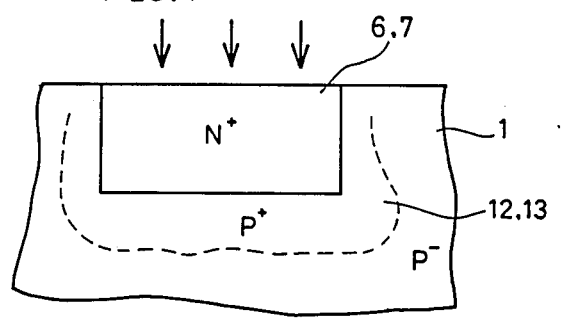
FIG. 4 is a cross sectional view showing another example of a semiconductor memory device fabricated according to the present invention.

FIG. 4 is a cross sectional view showing another embodiment of the present invention. In the embodiment shown in FIG. 4, P+ regions 12 and 13 as high density regions are formed by ion implantation method in such a manner that they surround the N+ region 7 as a bit line and the N+ region 6 as a charge storage region, respectively. Thus, P+ regions 12 and 13 having higher density than that of the P+ type semiconductor substrate are formed by ion implantation to surround N+ regions 6 and 7, respectively, so that electrons diffused from the P− type semiconductor substrate 1 are recombined in the P+ regions 12 and 13 and they do not reach each of the regions 6 and 7. Therefore, the number of the electrons is larger than that of the electrons generated by the irradiation of α ray or the like and combined with holes. In addition, electrons are prevented from diffusing into each of the N+ regions 6 and 7, thereby eliminating the generation of soft errors.

Since the device is made stable against soft errors, commonly required resin coating becomes unnecessary. In addition, by employing a bit line barrier, common resin coating becomes unnecessary.

This embodiment also can be applied to the N+ region of the sense amplifier and to the N+ region of a peripheral circuit. In addition, this embodiment can be applied not only to the dynamic type RAM but also to a static type RAM and it can be applied not only to a N channel but also to a P channel, an MOS device, bipolar device and the like.

Figure 5:
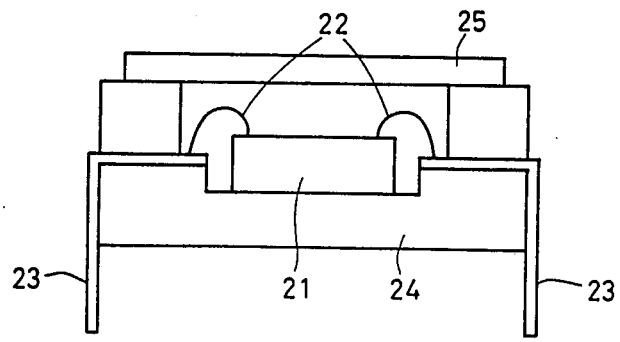
FIGS. 5, 6 and 7 are schematic diagrams of the semiconductor device contained in a package fabricated according to the present invention.
Figure 6:
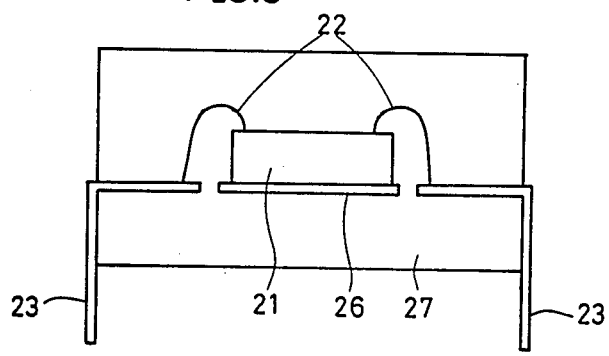
Figure 7:
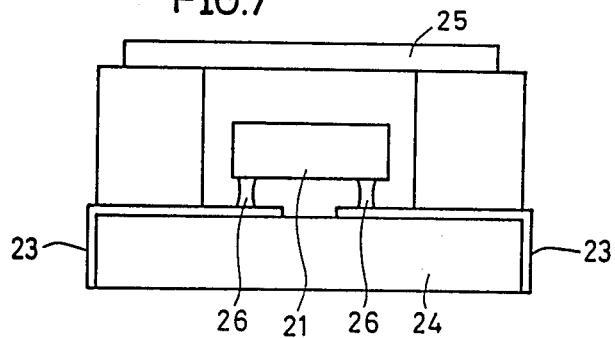

FIGS. 5, 6 and 7 show examples of memory cells fabricated according to the present invention contained in packages.

In the example shown in FIG. 5, a memory chip 21 is positioned on a ceramic body 24, the memory chip 21 is connected to an external lead 23 by a bonding wire 22 and the upper portion of the memory chip 21 is sealed by a lid 25.

In the example shown in FIG. 6, the device is contained in a resin mold package. A memory chip 21 is positioned on a frame 26, the memory chip 21 is connected to an external lead 23 by a bonding wire 22 and the whole device is molded by a resin 27.

In the example shown in FIG. 7, a memory chip 21 is contained by a flip chip method, in which an external lead 23 is formed on a ceramic body 24, the memory chip 21 is positioned on the external lead 23 with frames 26 interposed therebetween and the upper portion of the memory chip 21 is sealed by a lid 25.

The material for forming each of the packages shown in FIGS. 5, 6 and 7 has been known and it need not be a material having low emissivity of α particles and in addition an α particle prevention film on the surface of the chip becomes unnecessary.

Though not shown, by applying the present invention, the α particle prevention film of the chip surface and a special package material become unnecessary in the case where the memory chip 21 is contained in the SOJ, ZIP and module type package, thereby enabling decrease of manufacturing steps and the decrease of processing cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a semiconductor device wherein a high density region (9) of a first conductivity type having higher density than that of a semiconductor substrate (1) is formed to surround a region (7) of a second conductivity type formed on said semiconductor substrate (1) of a first conductivity type, comprising the steps of forming a first insulating film (12) on said semiconductor substrate (1) of the first conductivity type,
  forming an impurity diffused region by selectively diffusing an impurity of the first conductivity type using mask patterns (13, 14) against thermal oxidation,
  depositing a second insulating film on said first insulating film (12) and said mask patterns (13, 14) and thereafter performing anisotropic etching to leave said second insulating film (15) only at a step portion of said first insulating film (12),
  performing thermal oxidation using said left second insulating film (15) as a mask and said first insulating film (12) as nuclei to form an element separating insulating film (8) and extending said impurity diffused region to form a high density region (9),
  removing said first and second insulating films (12, 15) to form a gate electrode (3) on said semiconductor substrate (1) with a gate insulating film (4) interposed therebetween, and
  forming regions (6, 7) of the second conductivity type by selectively implanting and diffusing impurity of the second conductivity type using said gate insulating film (4) and the element separating insulating film (8) as masks.

2. A method for fabricating a semiconductor device according to claim 1, wherein
  said region of the second conductivity type is a region as a bit line.

3. A method for fabricating a semiconductor device according to claim 1, wherein
  said region of the second conductivity type is the charge storage region.

4. A method for fabricating a semiconductor device according to claim 1, wherein
  the density of said high density region is selected to be more than ten times higher than the density of said semiconductor substrate.

5. A method for fabricating a semiconductor device according to claim 1, wherein
  the density of said semiconductor substrate is in the range of $10^{13}$ to $10^{16}$/cm$^3$ and the density of said high density region is selected to be in the range of $10^{14}$ to $10^{18}$/cm$^3$.

6. A method for fabricating a semiconductor device in which a high density region (9) of a first conductivity type having higher density than that of a semiconductor substrate (1) is formed to surround a region (7) of a second conductivity type formed on said semiconductor substrate (1) of the first conductivity type, comprising the steps of forming a first insulating film (12) on said semiconductor substrate (1) of the first conductivity type,
  forming a high density region (9) of the first conductivity type having higher density than that of said semiconductor substrate (1) by implanting ions using a mask pattern (13, 14) against thermal oxidation,
  depositing a second insulating film on said first insulating film (12) and said mask pattern (13, 14) and thereafter performing anisotropic etching to leave said second insulating film (15) only at a step portion of said first insulating film (12)
  forming an element separating insulating film (8) by performing thermal oxidation using said left second insulating film (15) as a mask and said first insulating film (12) as nuclei,
  forming a gate electrode (3) on said semiconductor substrate (1) with a gate insulating film (4) interposed therebetween by removing said first and second insulating films (12, 15), and
  forming regions (6, 7) of the second conductivity type by selectively implanting and diffusing ions of the second conductivity type using said gate insulating film (4) and the element separating insulating film (8) as masks.

7. A method for fabricating a semiconductor device according to claim 6, wherein
said region of the second conductivity type is a region as a bit line.

8. A method for fabricating a semiconductor device according to claim 6, wherein
said region of the second conductivity type is a charge storage region.

9. A method for fabricating a semiconductor device according to claim 6, wherein
the density of said high density region is selected to be more than ten times higher than the density of said semiconductor substrate.

10. A method for fabricating a semiconductor device according to claim 6, wherein
the density of said semiconductor substrate is in the range of $10^{13}$ to $10^{16}/cm^3$ and the density of said high density region is selected to be in the range of $10^{14}$ to $10^{18}/cm^3$.

* * * * *